(12) United States Patent
Muchherla et al.

(10) Patent No.: US 11,620,074 B2
(45) Date of Patent: Apr. 4, 2023

(54) VOLTAGE BIN CALIBRATION BASED ON A VOLTAGE DISTRIBUTION REFERENCE VOLTAGE

(71) Applicant: MICRON TECHNOLOGY, INC., Boise, ID (US)

(72) Inventors: Kishore Kumar Muchherla, Fremont, CA (US); Devin M. Batutis, San Jose, CA (US); Xiangang Luo, Fremont, CA (US); Mustafa N. Kaynak, San Diego, CA (US); Peter Feeley, Boise, ID (US); Sivagnanam Parthasarathy, Carlsbad, CA (US); Sampath Ratnam, Boise, ID (US); Shane Nowell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/203,474

(22) Filed: Mar. 16, 2021

(65) Prior Publication Data
US 2022/0300186 A1  Sep. 22, 2022

(51) Int. Cl.
G06F 3/00 (2006.01)
G06F 3/06 (2006.01)

(52) U.S. Cl.
CPC .......... *G06F 3/0653* (2013.01); *G06F 3/0604* (2013.01); *G06F 3/0655* (2013.01); *G06F 3/0679* (2013.01)

(58) Field of Classification Search
None
See application file for complete search history.

(56) References Cited

U.S. PATENT DOCUMENTS

| 2019/0107961 A1* | 4/2019 | Lee | G06F 3/0653 |
| 2020/0250030 A1* | 8/2020 | Sandell | H03M 13/45 |
| 2022/0050777 A1* | 2/2022 | Sheperek | G11C 16/3418 |

* cited by examiner

*Primary Examiner* — Midys Rojas
(74) *Attorney, Agent, or Firm* — Lowenstein Sandler LLP

(57) ABSTRACT

A current memory access voltage distribution is measured for a memory page of a block family associated with a first voltage bin of a plurality of voltage bins at a memory device. The first voltage bin is associated with a first voltage offset. A current value for a reference voltage is determined based on the current memory access voltage distribution measured for the memory page. An amount of voltage shift for the memory page is determined based on the current value for the reference voltage a prior value for the reference voltage. The prior value for the reference voltage is associated with a prior memory access voltage distribution for the memory page. In response to a determination that the amount of voltage shift satisfies a voltage shift criterion, the block family is associated with a second voltage bin of the plurality of voltage bins. The second voltage bin is associated with a second voltage offset.

20 Claims, 12 Drawing Sheets

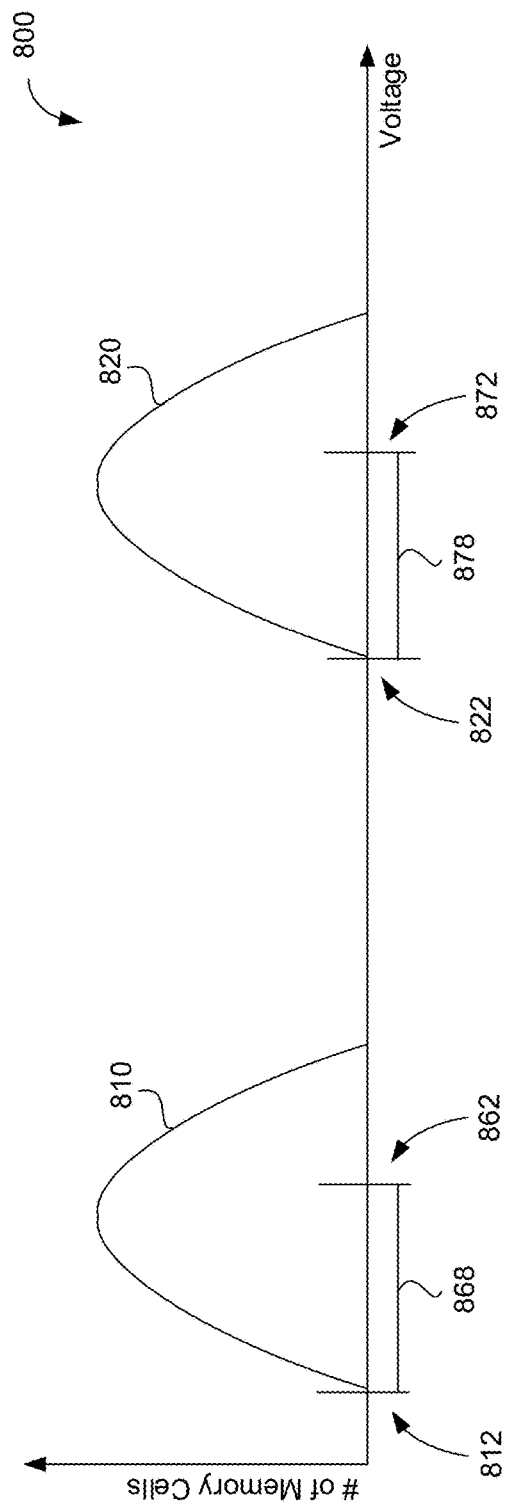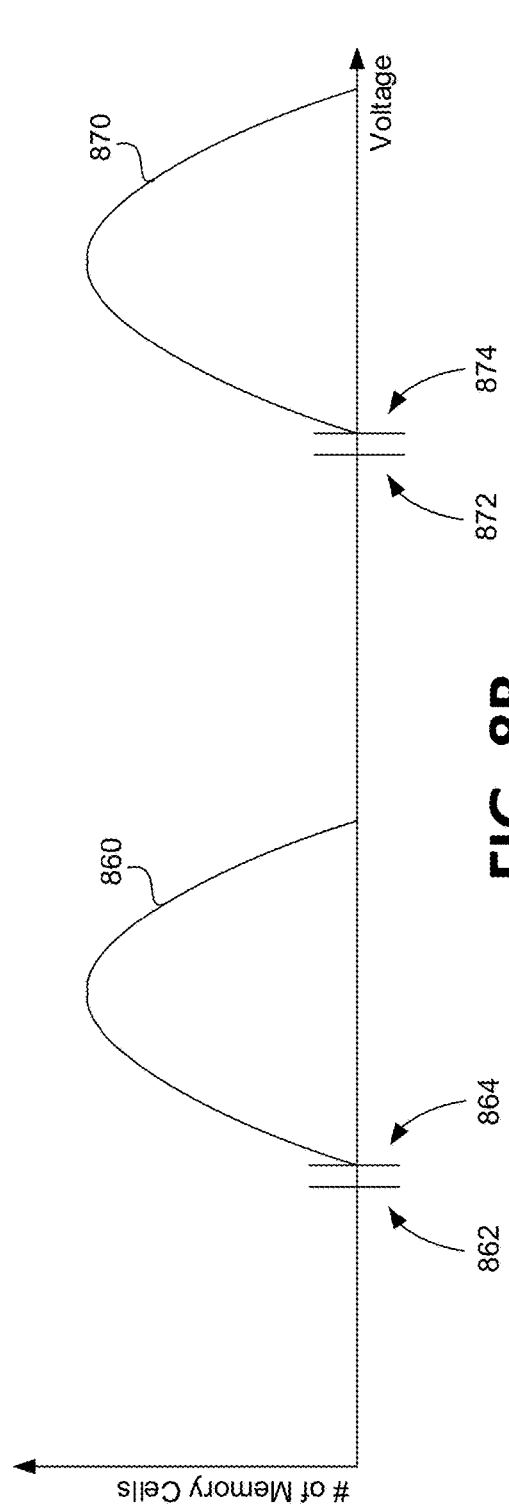
FIG. 8A
FIG. 8B

VOLTAGE BIN CALIBRATION BASED ON A VOLTAGE DISTRIBUTION REFERENCE VOLTAGE

TECHNICAL FIELD

Embodiments of the disclosure relate generally to memory sub-systems, and more specifically, relate to voltage bin calibration based on a voltage distribution reference voltage.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 8A-8B illustrates an example of detecting voltage shift using a memory access voltage distribution reference voltage, in accordance with some embodiments of the present disclosure.

DETAILED DESCRIPTION

Figure 1:
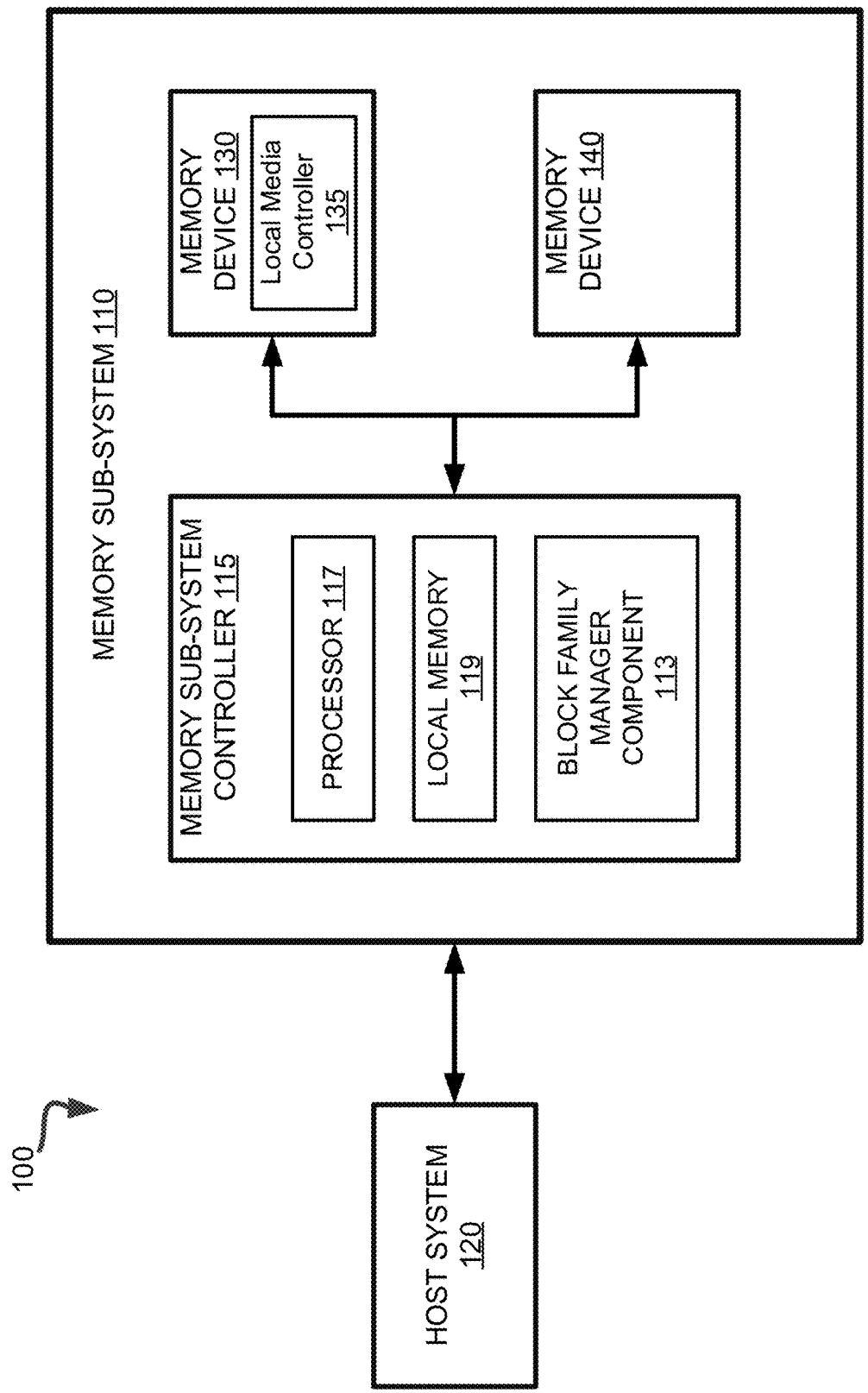
FIG. 1 illustrates an example computing system that includes a memory sub-system, in accordance with some embodiments of the present disclosure.

Aspects of the present disclosure are directed to voltage bin calibration based on a voltage distribution reference voltage. A memory sub-system can be a storage device, a memory module, or a combination of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. "Block" herein shall refer to a set of contiguous or non-contiguous memory pages. An example of a "block" is an "erasable block," which is the minimal erasable unit of memory, while "page" is a minimal writable unit of memory. Each page includes a set of memory cells. A memory cell is an electronic circuit that stores information.

Data operations can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., ECC codeword, parity code), data version (e.g. used to distinguish age of data written), valid bitmap (which LBAs or logical transfer units contain valid data), etc.

A memory device includes multiple memory cells, each of which can store, depending on the memory cell type, one or more bits of information. A memory cell can be programmed (written to) by applying a certain voltage to the memory cell, which results in an electric charge being held by the memory cell, thus allowing modulation of the voltage distributions produced by the memory cell. Moreover, precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information. "Threshold voltage" herein shall refer to the voltage level that defines a boundary between two neighboring voltage distributions corresponding to two logical levels. Thus, a read operation can be performed by comparing the measured voltage exhibited by the memory cell to one or more reference voltage levels in order to distinguish between two logical levels for single-level cells and between multiple logical levels for multi-level cells.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. Accordingly, failure to mitigate the temporal voltage shift caused by the slow charge loss can result in the increased bit error rate in read operations.

However, various common implementations either fail to adequately address the temporal voltage shift or employ inefficient strategies resulting in high bit error rates and/or exhibiting other shortcomings. Embodiments of the present disclosure address the above-noted and other deficiencies by implementing a memory sub-system that employs block family based error avoidance strategies, thus significantly improving the bit error rate exhibited by the memory sub-system.

In accordance with embodiments of the present disclosure, the temporal voltage shift is selectively tracked for a programmed set of memory cells grouped by block families, and appropriate voltage offsets, which are based on block affiliation with a certain block family, are applied to the base read levels in order to perform read operations. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics for slow charge loss. A block family can be made with any granularity containing only whole codewords, whole pages, whole super pages, or whole superblocks, or any combination of these. "Data state metric" herein shall refer to a quantity that is measured or inferred from the state of data stored on a memory device. Specifically, the data state metrics can reflect the state of the temporal voltage shift, the degree of read disturb, and/or other measurable functions of the data state. A composite data state metric is a function (e.g., a weighted sum) of a set of component state metrics.

In these embodiments, a block family experiences a specified temperature range using an aggregate temperature, which can change or be defined according to a temperature metric in different embodiments. For example, in response to a timer reaching a soft closure value, a controller of the memory sub-system can perform a soft closure of the block family (i.e., signal to a block family manager that the open time for the block is coming to an end and prepare for a hard closure of the block family). Or, alternatively, in response to an aggregate temperature (based on temperature values received from temperature sensor(s) of the memory device) being greater than or equal to a specified threshold temperature, the controller can likewise perform a soft closure of the block family.

After performing the soft closure, the memory sub-system can continue to program to a partially written block until the timer reaches a hard closure value or the block family satisfies a hard closure criteria. In this way, the memory sub-system has an extension time before the hard closure during which to complete writing to the partially written block, decide whether to partition the block, or to write dummy data to the unwritten portion of the block after hard closure. After hard closure of one block family (i.e., the memory sub-system controller no longer writes data to the block family), further programming to dice of the memory device is to a newly opened block family. Given that wear-leveling keeps block to similar program erase counts, the time elapsed after programming and temperature are the main factors affecting the temporal voltage shift, all blocks and/or partitions within a single block family are presumed to exhibit similar distributions of threshold voltages in memory cells, and thus would require the same voltage offsets to be applied to the base read levels for read operations. "Base read level" herein shall refer to the initial threshold voltage level exhibited by the memory cell immediately after programming. In some implementations, base read levels can be stored in the metadata of the memory device.

Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

The memory sub-system controller can periodically perform a calibration process (e.g., a calibration scan) in order to associate each die of every block family with one of the predefined threshold voltage offset bins (referred to as voltage bins), which is in turn associated with the voltage offsets to be applied for read operations. In one embodiment, the associations of pages or blocks with block families, and block families and dies with voltage bins, can be represented by metadata stored in respective metadata tables maintained by the memory sub-system controller.

The threshold voltage for each memory cell can continue to shift even when a memory device is powered off. Depending on the amount of time the memory device is powered off, the temporal voltage shift of each block family can be significant. As a result, the bin allocation to block families stored in respective metadata tables prior to the memory device being powered off can be inaccurate when the memory device is powered back on. In some instances, a memory sub-system does not have a timer or a clock that tracks the amount of time a memory device is powered off. As a result, when the memory device is powered back on, the memory sub-system controller is unaware of the amount of time the device was powered off and is therefore unaware of the temporal voltage shift that has occurred for each block family. Thus, the memory sub-system controller cannot adjust the voltage bin allocation to block families without calibration of at least some pages or blocks.

The memory sub-system controller can periodically perform a scan of the memory device to calibrate the threshold voltage offsets to be applied to each block family (referred to as a calibration scan). In some instances, the memory sub-system controller can perform the calibration scan by performing a set of read operations performed for a block family using voltage offsets associated with each voltage bin of the memory device. The memory sub-system controller can identify a previously performed read operation that resulted in an optimal data state metric (e.g., the lowest bit error rate, which is the number of received bits that have been altered due to an error at the memory sub-system) and determine the voltage offset that has been applied for the identified read operation. In one example, the memory sub-system controller can perform the calibration scan for each block of each block family on each die of the memory device. As a memory device can include hundreds or sometimes thousands of pages or blocks, periodically performing a full scan of the memory device can take a significant amount of time and utilize a significant amount of system resources.

Aspects of the present disclosure address the above and other deficiencies by calibrating voltage bins at a memory device based on a voltage shift detected using a reference voltage for a memory access voltage distribution (i.e., a threshold voltage distribution). The reference voltage can correspond to a particular point (e.g., a tail end) or a particular quantile (e.g., a 50% quantile) of a voltage distribution for a respective logical level of memory cells at a memory device. At a time period immediately or soon after programming a block family, the memory pages of the block family can be associated with a particular memory access voltage distribution (referred to as a prior memory access voltage distribution). In one example, the reference voltage can correspond to a voltage for memory cells at a tail end of the voltage distribution. A memory access voltage for memory cells associated with the tail end of the prior memory access voltage distribution can approximately correspond to the threshold voltage used by the memory sub-system controller to program data to the memory cells (referred to as the programming voltage). As such, a value of the reference voltage that is associated with the prior memory access voltage distribution (referred to as the prior value of the reference voltage) corresponds to the programming voltage for the memory cells. In another example, the reference voltage can correspond to a voltage for memory cells at a particular quantile (e.g., a 50% quantile) of the voltage distribution.

During operation of a memory device, a memory sub-system controller can measure a memory access voltage distribution for memory cells of a memory page of a block family (referred to as a current memory access voltage distribution). The memory sub-system controller can determine a current value for the reference voltage based on the current memory access voltage distribution and compare the current value to the prior value for the reference voltage. For example, the memory sub-system controller can determine a difference between the current voltage for memory cells associated with the particular point (e.g., the tail end) or the particular quantile (e.g., the 50% quantile) of the current memory access voltage distribution and the prior value for the memory cells associated with the corresponding point or the corresponding quantile of the prior memory access voltage distribution. The difference between the current value and the prior value for the reference voltage correspond to an amount of voltage shift of the block family since the time period immediately or soon after the memory sub-system controller programmed memory pages of the block family. The voltage shift can be dependent on and amount of time that has passed since the memory sub-system controller programmed the memory pages, a change in temperature from the time of programming and/or a number of program/erase (PE) cycles for the memory. The memory sub-system controlled can associate the block family with an appropriate voltage bin that corresponds with the determined amount of voltage shift.

Advantages of the present disclosure include, but are not limited to, decreasing an amount of memory sub-system resources consumed during a calibration scan for the memory device. Instead of performing read operations at hundreds or thousands of pages or blocks to determine an appropriate voltage offset for each block family, the memory sub-system controller can detect the amount of voltage shift for memory pages of a block family based on a difference between a current value and a prior value for a reference voltage associated with a voltage distribution measured for a memory page. By performing a single measurement operation for a memory page instead of multiple read operations for hundreds or thousands of pages or blocks, a significant amount of memory sub-system resources are available for other processes at the memory sub-system. As a result, an overall efficiency of the memory sub-system increases and an overall latency of the memory sub-system decreases. Additionally, by using the programming voltage for memory cells to determine the prior value of a reference voltage, the memory sub-system controller does not measure the voltage distribution of the memory page immediately or soon after programming. Memory sub-system resources can therefore be allocated to performing memory access operations with respect to host data, which can increase overall performance (e.g., efficiency, latency, throughput, etc.) of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a block family manager component 113 that can select threshold voltage offset bins (referred to as voltage bins or bins) to be associated with block families at a memory device. In some embodiments, the memory sub-system controller 115 includes at least a portion of the block family manager component 113. For example, the memory sub-system controller 115 can include a processor 117 (processing device) configured to execute instructions stored in local memory 119 for performing the operations described herein. In some embodiments, the block family manager component 113 is part of the host system 110, an application, or an operating system. Further details regarding block families and block family manager component 113 are described below.

Figure 2:
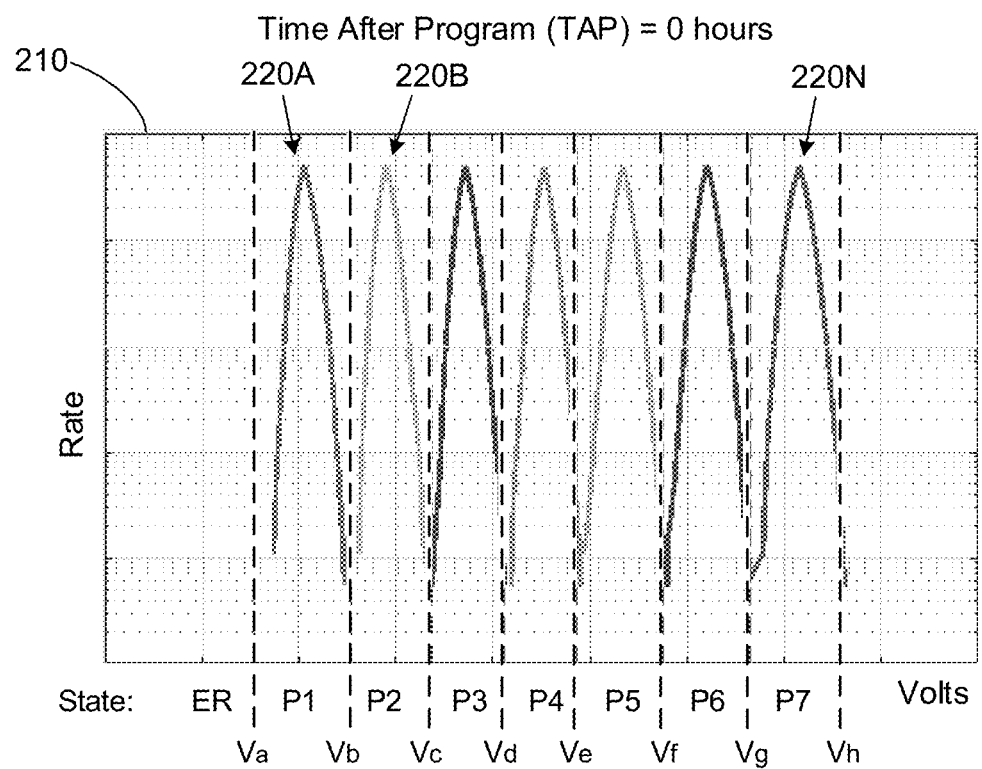
FIG. 2 schematically illustrates the temporal voltage shift caused by the slow charge loss exhibited by triple-level memory cells, in accordance with some embodiments of the present disclosure.
Figure 2:
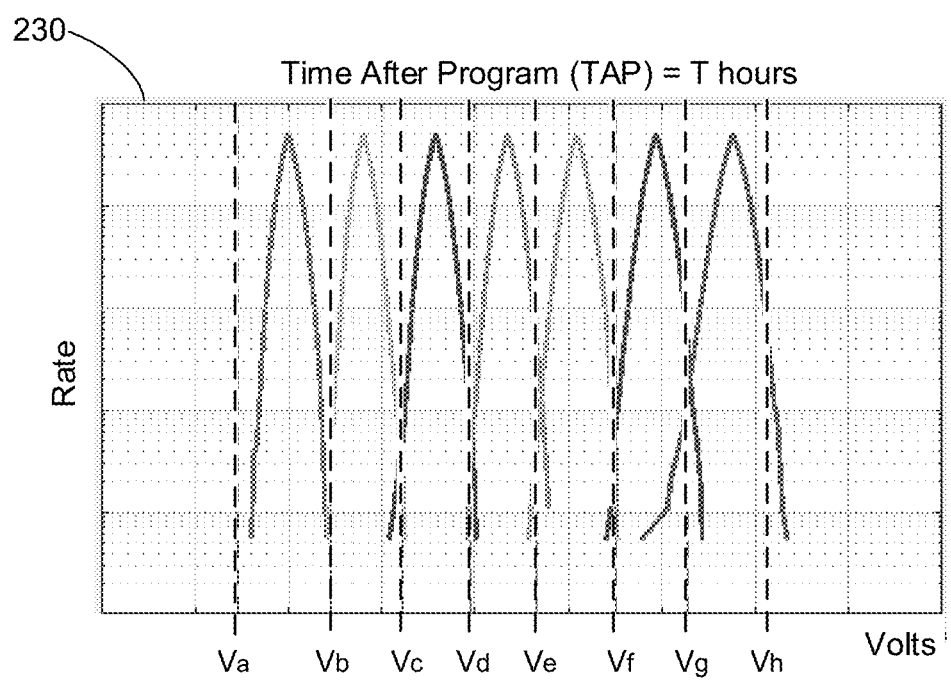

FIG. 2 schematically illustrates the temporal voltage shift caused by the slow charge loss exhibited by triple-level memory cells, in accordance with some embodiments of the present disclosure. While the illustrative example of FIG. 2 utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

As noted above, a memory cell can be programmed (written to) by applying a certain voltage to the memory cell, which results in an electric charge being held by the memory cell, thus allowing modulation of the voltage distributions produced by the memory cell. Precisely controlling the amount of the electric charge stored by the memory cell allows to establish multiple threshold voltage levels corresponding to different logical levels, thus effectively allowing a single memory cell to store multiple bits of information: a memory cell operated with $2^n$ different threshold voltage levels is capable of storing n bits of information.

In FIG. 2, each graph 220A-220N shows a voltage distribution produced by memory cells programmed by a respective write level (which can be assumed to be at the midpoint of the distribution) to encode a corresponding logical level (e.g., "000" through "111" in case of a TLC). In order to distinguish between neighboring distributions (corresponding to two different logical levels), the read threshold voltage levels (shown by dashed vertical lines) are defined, such that any measured voltage that falls below a threshold level is associated with one distribution of the pair of neighboring distributions, while any measured voltage that is greater than or equal to the threshold level is associated with another distribution of the pair of neighboring distributions.

As seen from comparing example charts 210 and 230, which reflect the time periods immediately after programming and a respective number of hours after programming, respectively, the voltage distributions change in time due to the slow charge loss, which results in drifting values of the read threshold voltage levels, which are shown by dashed vertical lines. In various embodiments of the present disclosure, the temporal voltage shift is selectively tracked for programmed pages or blocks grouped by block families, and appropriate voltage offsets, which are based on page or block affiliation with a certain block family, are applied to the base read levels in order to perform read operations.

Figure 3:
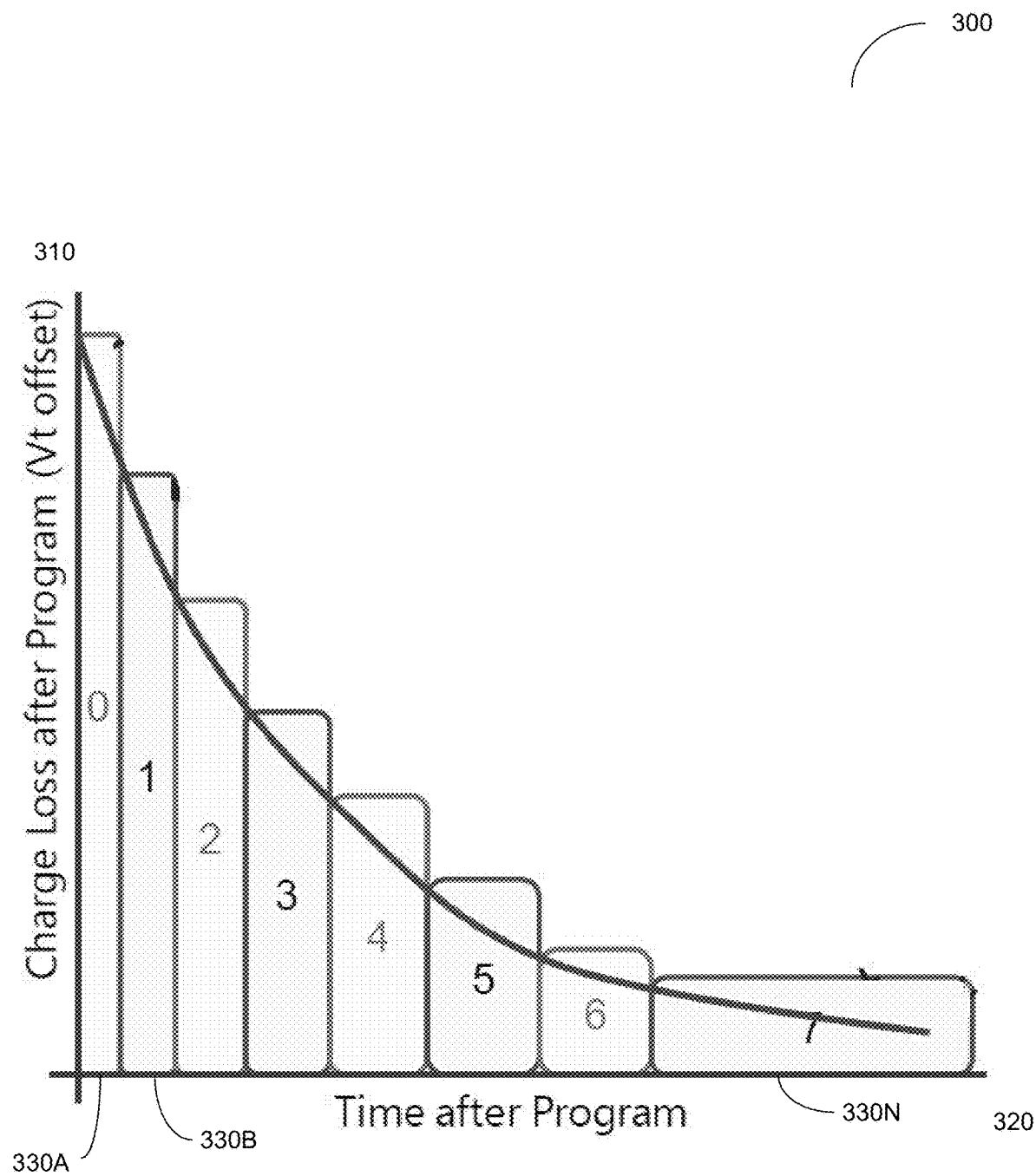
FIG. 3 depicts an example graph illustrating the dependency of the threshold voltage offset on the time after program (i.e., the period of time elapsed since the block had been programmed, in accordance with some embodiments of the present disclosure.

FIG. 3 depicts an example graph illustrating the dependency of the threshold voltage offset on the time after program (i.e., the period of time elapsed since the page had been programmed, in accordance with some embodiments of the present disclosure. As schematically illustrated by FIG. 3, block families of the memory device are grouped into bins 330A-330N, such that each block family includes one or more pages or blocks that have been programmed within a specified time window and a specified temperature window. As noted herein above, since the time elapsed after programming and temperature are the main factors affecting the temporal voltage shift, all pages, blocks, and/or partitions within a single block family 310 are presumed to exhibit similar distributions of threshold voltages in memory cells, and thus would require the same voltage changes for read operations.

Block families can be created asynchronously with respect to page programming events. In an illustrative example, the memory sub-system controller 115 of FIG. 1 can create a new block family whenever a specified period of time (e.g., a predetermined number of minutes) has elapsed since creation of the last block family or whenever the reference temperature of memory cells, which is updated at specified time intervals, has changed by more than a specified threshold value since creation of the current block family.

A newly created block family can be associated with a particular bin (e.g., bin 0, bin 1, etc.). Then, the memory sub-system controller can periodically perform a calibration process in order to associate each die of every block family with one of the predefines voltage bins (bins 0-7 in the illustrative example of FIG. 3), which is in turn associated with the voltage offset to be applied for read operations. The associations of blocks with block families and block families and dies with voltage bins can be stored in respective metadata tables maintained by the memory sub-system controller.

Figure 4:
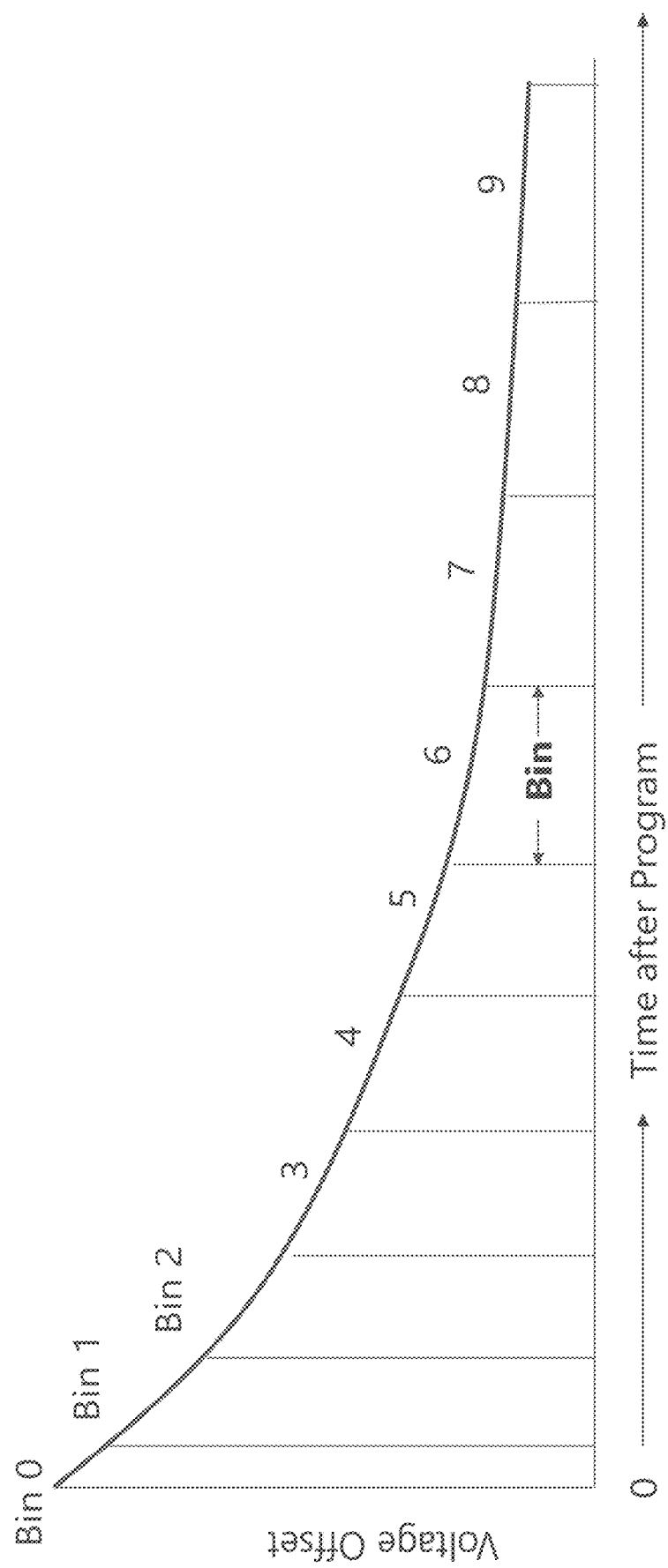
FIG. 4 schematically illustrates a set of predefined threshold voltage offset bins, in accordance with embodiments of the present disclosure.

FIG. 4 schematically illustrates a set of predefined threshold voltage offset bins (referred to as voltage bins or bins herein), in accordance with embodiments of the present disclosure. As schematically illustrated by FIG. 4, the threshold voltage offset graph can be subdivided into multiple voltage bins, such that each voltage bin corresponds to a predetermined range of threshold voltage offsets. While the illustrative example of FIG. 4 defines ten voltage bins for a single valley, in other implementations, various other numbers of voltage bins can be employed.

The memory sub-system controller can associate each die of every block family with a voltage bin, based on a periodically performed calibration process. The calibration process defines a set of threshold voltage offsets to be applied to the base voltage read level in order to perform read operations. In some embodiments, the calibration process involves performing, with respect to a specified number of randomly selected pages or blocks within the block family that is being calibrated, read operations utilizing different threshold voltage offsets, and choosing the threshold voltage offset that minimizes the error rate (e.g., a bit error rate) of the read operation. In other or similar embodiments, the calibration process involves sampling memory pages (i.e., measuring an access voltage distribution for memory cells of a memory page) of a block family and determining an amount voltage distribution shift from an access voltage distribution for the block family immediately or soon after programming. Further details regarding the calibration process are provided with respect to FIGS. 7 and 10.

Figure 5:
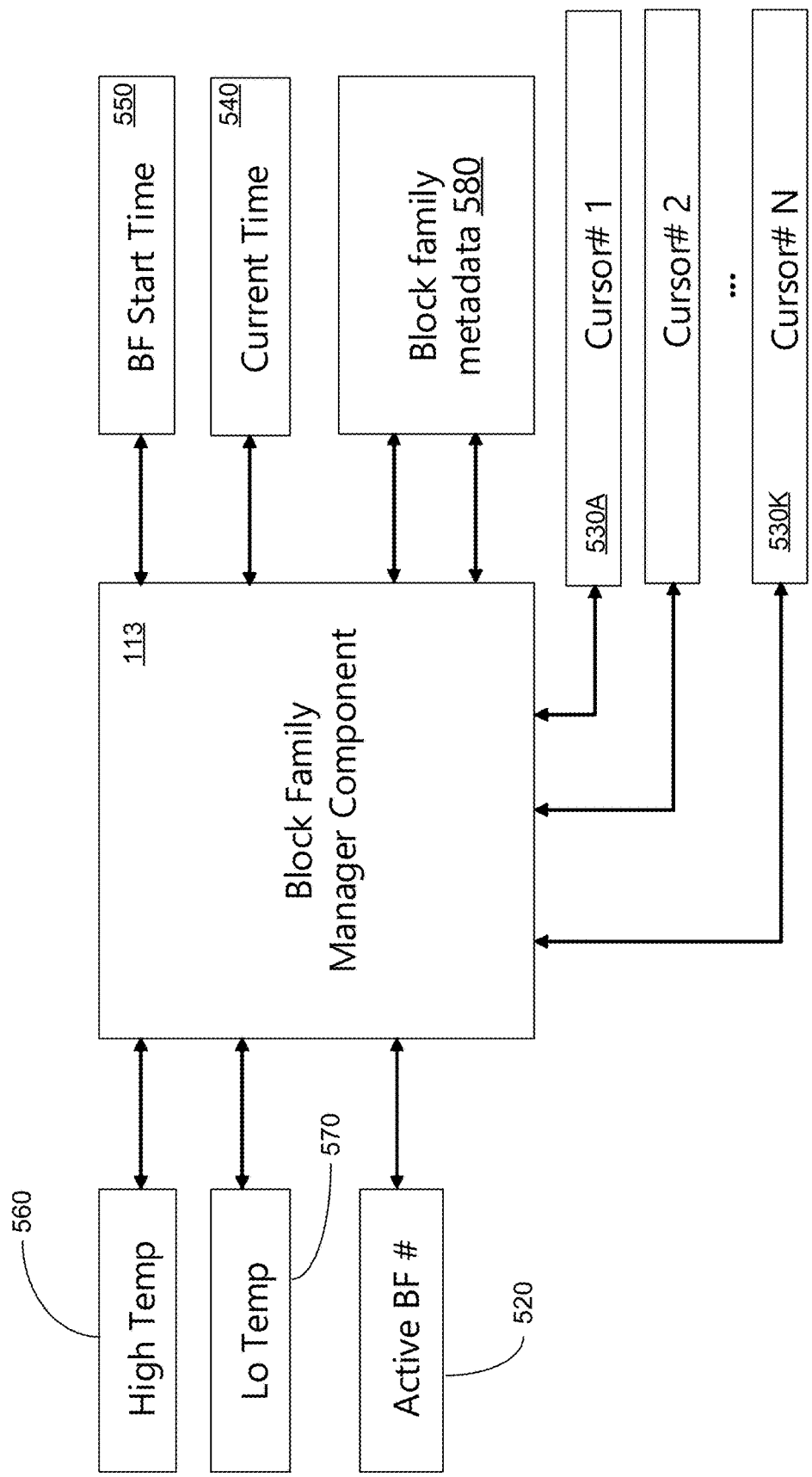
FIG. 5 illustrates block family management operations implemented by a block family manager component, in accordance with embodiments of the present disclosure.

FIG. 5 schematically illustrates block family management operations implemented by the block family manager component 113 of the memory sub-system controller 115, in accordance with embodiments of the present disclosure. As schematically illustrated by FIG. 5, the block family manager component 113 can maintain, in a memory variable, an identifier 520 of the active block family, which is associated with one or more pages or blocks of cursors 530A-530K as they are being programmed. "Cursor" herein shall broadly refer to a location on the memory device to which the data is being written.

The memory sub-system controller can utilize a power on minutes (POM) clock for tracking the creation times of block families. In some implementations, a less accurate clock, which continues running when the controller is in various low-power states, can be utilized in addition to the POM clock, such that the POM clock is updated based on the less accurate clock upon the controller wake-up from the low-power state.

Thus, upon initialization of each block family, block family manager component 113 stores the current time 540 in a memory variable as the block family start time 550. As the pages or blocks are programmed, block family manager component 113 compares the current time 540 to the block family start time 550. Responsive to detecting that the difference of the current time 540 and the block family start time 550 is greater than or equal to the specified time period (e.g., a predetermined number of minutes), block family manager component 113 updates the memory variable storing the active block family identifier 520 to store the next block family number (e.g., the next sequential integer number), and the memory variable storing the block family start time 550 is updated to store the current time 540.

The block family manager component 113 also maintains two memory variables for storing the high and low reference temperatures of a selected die of each memory device. Upon initialization of each block family, the high temperature 560 and the low temperature 570 variable store the value of the current temperature of the selected die of the memory device. In operation, while the active block family identifier 520 remains the same, temperature measurements are periodically obtained and compared with the stored high temperature 560 and the low temperature 570 values, which are updated accordingly: should the temperature measurement be found to be greater than or equal to the value stored by the high temperature variable 560, the latter is updated to store that temperature measurement; conversely, should the temperature measurement be found to fall below the value stored by the low temperature variable 570, the latter is updated to store that temperature measurement.

The block family manager component 113 can further periodically compute the difference between the high temperature 560 and the low temperature 570. Responsive to determining that the difference between the high temperature 560 and the low temperature 570 is greater than or equal to a specified temperature threshold, the block family manager component 113 can close the existing block family and can create a new active block family: the memory variable storing the active block family identifier 520 is updated to store the next block family number (e.g., the next sequential integer number), the memory variable storing the block family start time 550 is updated to store the current time 540, and the high temperature 560 and the low temperature 570 variables are updated to store the value of the current temperature of the selected die of the memory device. At the time of programming a block, block family manager component 113 associates the block with the currently active block family. The association of each block with a corresponding block family is reflected by the block family metadata 580.

As described previously, based on a periodically performed calibration process (e.g., a calibration scan), the block family manager component 113 associates each die of every block family with a voltage bin, which defines a set of threshold voltage offsets to be applied to the base voltage read level in order to perform read operations. In some embodiments, the calibration process involves sampling memory cells for a memory page of a block family to measure a current memory access voltage distribution for the memory page (referred to as current voltage distribution herein). In some embodiments, the current voltage distribution can correspond to an average distribution for a set of sampled memory cells. In other or similar embodiments, the current voltage distribution can be a different aggregate measure. Block family manager component 113 can determine a current value for a reference voltage based on the current voltage distribution and compare the current value for the reference voltage to a prior value for the reference voltage. The prior value for the reference voltage is associated with a prior memory access voltage distribution (referred to as a prior voltage distribution) that associated with the block family at an instance in time that is prior to measuring the current memory access voltage distribution for the memory page (e.g., when data for the memory page is programmed at the memory device). Block family manager component 113 uses the current value and the prior value for the reference voltage to determine the amount of voltage shift for the block family since the instance in time associated with the prior reference value. The determined amount of voltage shift can correspond to a threshold voltage offset that is previously determined (e.g., based on experimental data, etc.) to minimize the error rate of operations such as read operations performed for the block family. Block family manager 113 can determine the particular voltage bin that corresponds to the threshold voltage offset and update metadata for the block family to correspond to the determined voltage bin.

In some embodiments, the frequency at which the memory sub-system controller performs the calibration process for each voltage bin can be based on an age of the block families associated with the voltage bin. As described previously with respect to FIG. 3, newly created block families can be associated with voltage bin 0 and older block families on the memory device can be associated with subsequently numbered voltage bins. The temporal voltage shift for block families in a younger voltage bin is faster than the temporal voltage shift for block families associated with an older voltage bin. This is illustrated in FIG. 4, as the voltage offset for bin 0 shifts at quicker rate than the voltage offset for older voltage bins (e.g., voltage bins 9, 8, 7, etc.). Therefore, the memory sub-system controller can perform the calibration process for block families associated with voltage bin 0 at a higher frequency than for block families associated with voltage bin 9 to associate each block family with an appropriate voltage bin.

Figure 6:
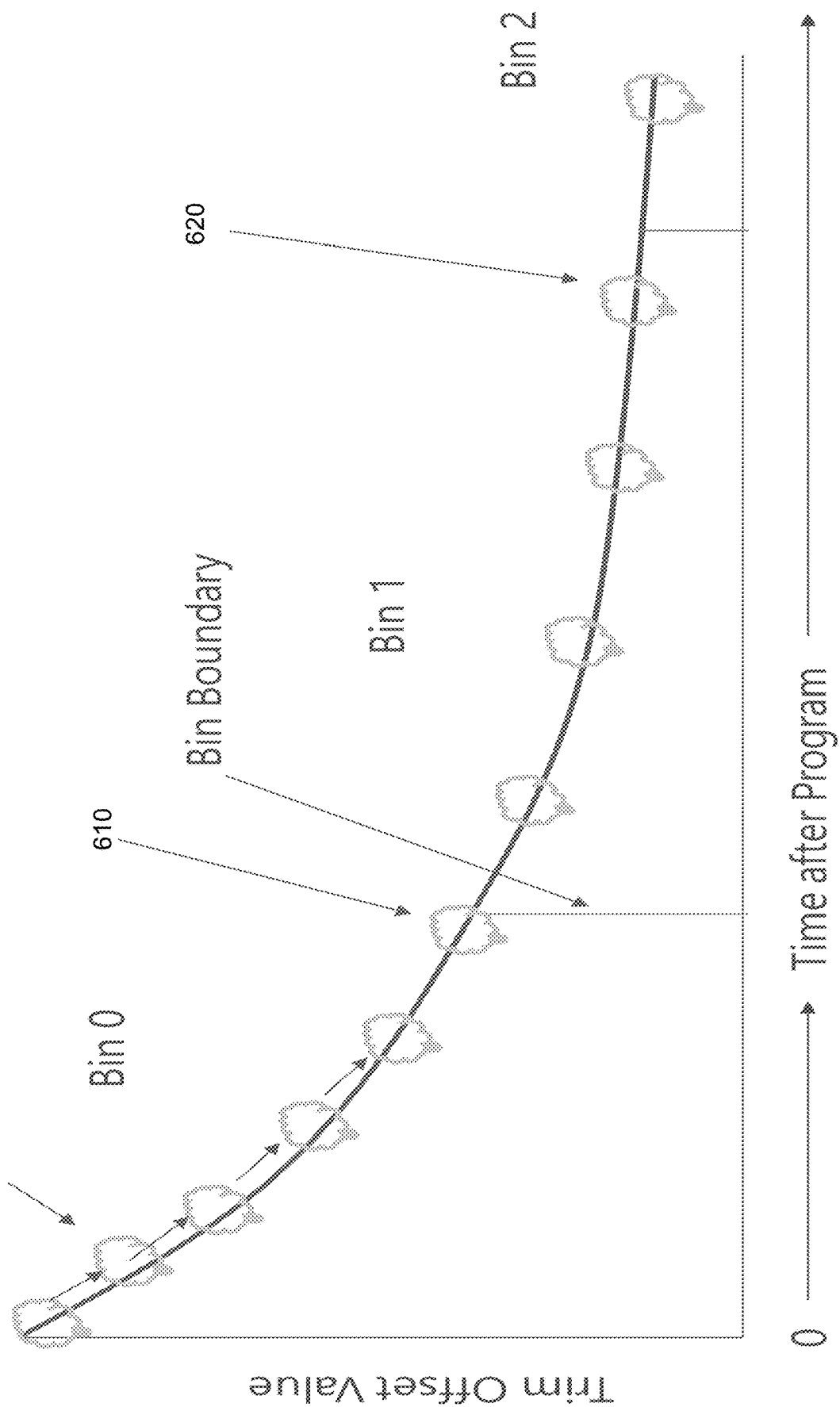
FIG. 6 schematically illustrates selecting block families for calibration, in accordance with embodiments of the present disclosure.

FIG. 6 schematically illustrates selecting block families for calibration, in accordance with embodiments of the present disclosure. Due to slow charge loss, the oldest block families in a voltage bin will migrate to the next voltage bin before any other block families of the current bin. As such, the memory sub-system controller can limit calibration operations to the oldest block families in a bin (e.g., block family 610 in bin 0 and block family 620 in bin 1). In some embodiments, the memory sub-system controller can identify the oldest block family in a voltage bin based on a bin boundary for the bin. A bin boundary can represent a boundary between two adjacent block families that are each associated with a different bin. The memory sub-system controller can identify the bin boundary for a particular voltage bin using a block family metadata table.

Referring back to FIG. 1, block family manager component 113 can be configured to periodically calibrate a memory device 130, 140 to associate block families with an appropriate voltage bin in view of an amount of temporal voltage shift. The block family can be associated with a first voltage distribution at a first time period (e.g., immediately or soon after data is programmed or written to memory pages of the block family). In accordance with some embodiments of the present disclosure, the first voltage distribution is referred to as a prior memory access voltage distribution. In some embodiments, block family manager component 113 can obtain the first voltage distribution by measuring one or more memory pages of the block family during the first period. In other or similar embodiments, block family manager component 113 can determine the first voltage distribution based on experimental or manufacturing data that is obtained for the memory device (e.g., prior to or during installation and/or initialization of the memory device at the memory sub-system). A first value for a reference voltage (also referred to herein as a prior value) can be determined based on the first voltage distribution. A reference voltage refers to a voltage at a particular point (e.g., a tail end) or a particular quantile (e.g., 50% quantile, 25% quantile, etc.) of a voltage distribution. In some embodiments, the voltage at a quantile that is associated with a highest amount of slow charge loss can be selected as the reference voltage.

At a second period of time subsequent to the first period of time, block family manager component 113 can perform a calibration scan for the block family by measuring one or more memory pages to obtain a second voltage distribution. In accordance with some embodiments of the present disclosure, the second voltage distribution is referred to as a current voltage distribution. Block family manager component 113 can compare a second value for the reference voltage (also referred to herein as a current value) to the first value for the reference voltage to determine the amount of temporal voltage shift for the block family since the first period of time. Block family manager component 113 can associate the block family with an appropriate voltage bin associated with a temporal voltage offset that corresponds to the determined amount of temporal voltage shift. Further details regarding the calibration process are provided with respect to FIGS. 7-11 herein.

Figure 7:
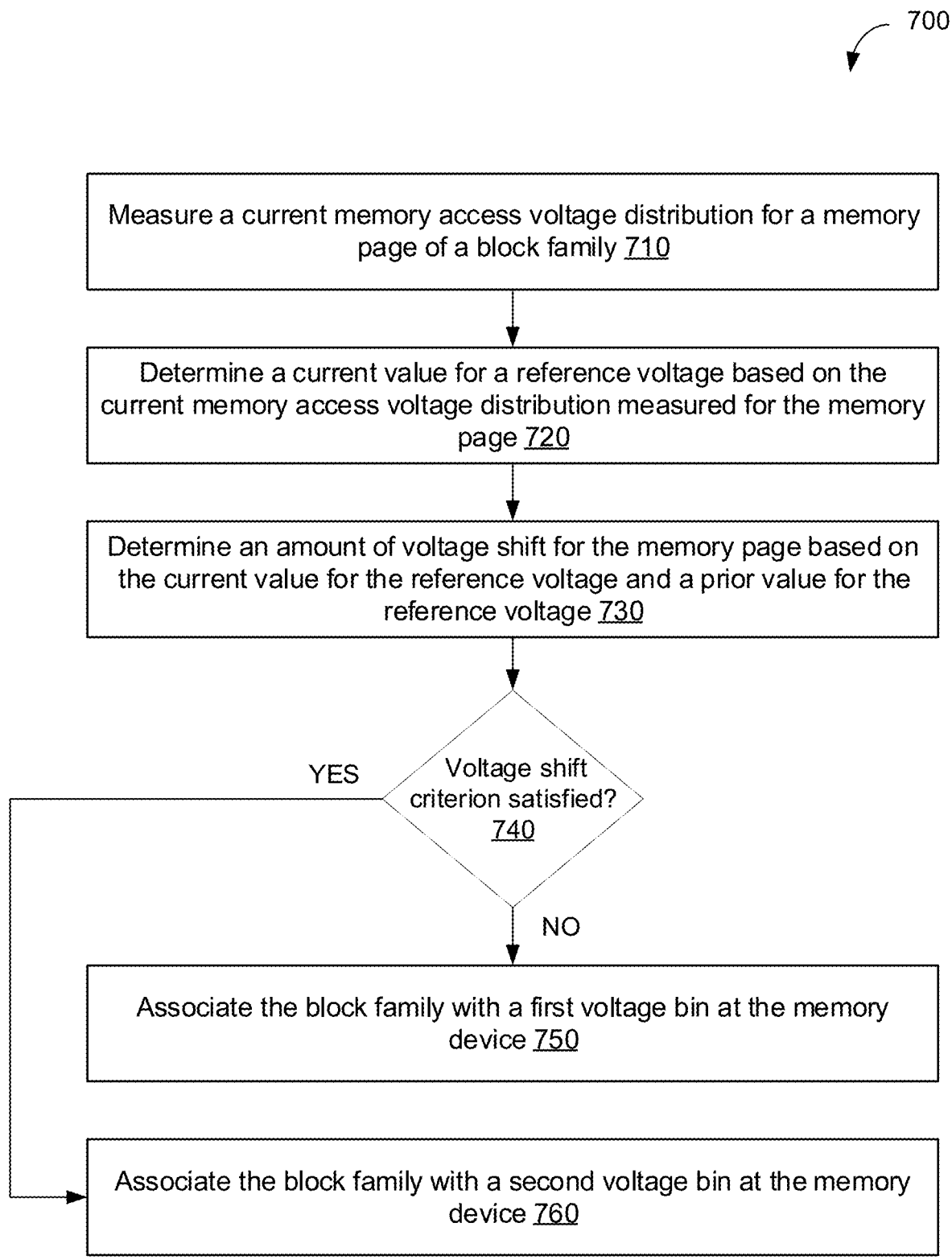
FIG. 7 is a flow diagram of an example method for voltage bin calibration based on a voltage distribution reference voltage, in accordance with some embodiments of the present disclosure.

FIG. 7 is a flow diagram of an example method 700 for voltage bin calibration based on a voltage distribution reference voltage, in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the block family manager component 113 of FIG. 1. In other or similar embodiments, one or more operations of method 700 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 710, processing logic measures a current voltage distribution for a memory page of a block family. In some embodiments, the block family is associated with a first voltage bin associated with a first voltage offset at the memory device. The processing logic can measure the current voltage distribution for the memory page in response to determining that the block family is to be calibrated, in accordance with some embodiments. For example, the processing logic can determine to calibrate the block family in response to determining that a corresponding threshold criterion has been satisfied. In one embodiment, the processing logic determines that the threshold criterion is satisfied when a threshold number of program and erase operations have been performed (i.e. a threshold number of program/erase (P/E) cycles have occurred) for the block family and/or the memory device. In some embodiments, the processing logic can select the memory page of the block family for measurement in accordance with a calibration policy associated with the memory device. In other or similar embodiments, the processing logic can select the memory page of the block family for measurement as a result of a random memory page selection operation performed during the calibration process.

Processing logic can measure the current voltage distribution for the memory page by sampling the memory page to determine the memory access voltage associated with one or more cells of the memory page. In some embodiments, processing logic can measure the voltage distribution by sampling each memory cell of the memory page. In other or similar embodiments, processing logic can measure the voltage distribution by sampling a subset of memory cells of the memory page (i.e., fewer than all memory cells of the memory page). The current voltage distribution can represent a difference between the memory access voltage for the cells of the memory page at the time period that the measurement is obtained for the block family.

Figure 9A:
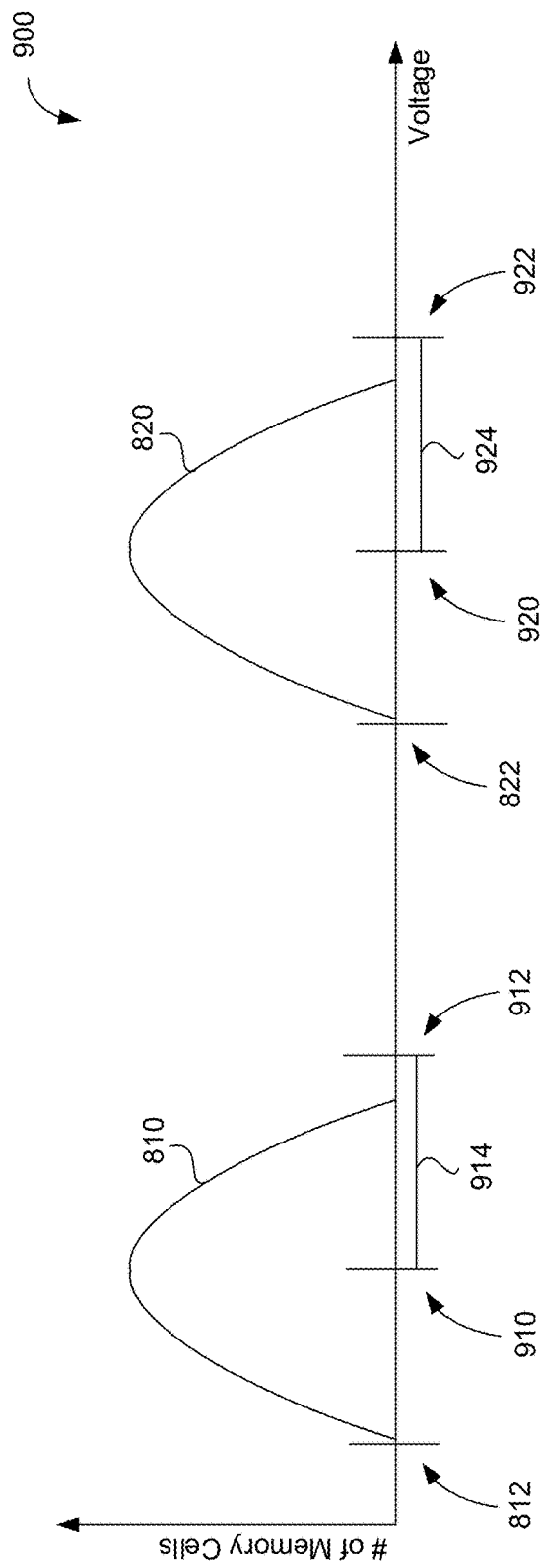
FIGS. 9A-9B also illustrates another example of detecting voltage shift using a memory access voltage distribution reference voltage, in accordance with some embodiments of the present disclosure.

FIGS. 8A and 9A illustrate current voltage distributions 810, 820 measured for a memory page, in accordance with embodiments of the present disclosure. As described with respect to FIG. 2, memory cells can be programmed by a respective write level to encode a corresponding logical level. In one example, voltage distributions 810 and 820 can be measured during a sampling operation performed for TLC memory cells of a memory page. In such example, voltage distribution 820 can correspond to a voltage distribution for a highest logical level associated with the TLC memory cell (e.g., "111") and voltage distribution 810 can correspond to a voltage distribution for a second highest logical level associated with the TLC memory cell (e.g., "110").

Referring back to FIG. 7, at block 720, processing logic determines a current value for a reference voltage based on the current voltage distribution measured for the memory page. As described above, a reference voltage refers to a voltage at a particular point (e.g., a tail end of the distribution) or a particular quantile (e.g., 50% quantile, 25% quantile, etc.) of the voltage distribution. In some embodiments, the reference voltage can be defined for the memory device prior to or during initialization of the memory device (e.g., by an operator or programmer of the memory device). In other or similar embodiments, the reference voltage can be selected in view of a performance metric (e.g., bit error rate) associated with the block family and/or the memory device, as described in further details below.

As described above, in some embodiments, the reference voltage can correspond to a voltage at particular point of the voltage distribution. For example, the reference voltage can correspond to a tail end of the voltage distribution. As illustrated in FIG. 8A, voltage 812 can correspond to a voltage measured at a tail end of voltage distribution 810 and voltage 822 can correspond to a voltage measured at a tail end of voltage distribution 822. As such, the current value of voltage 822 can be the current value for the reference voltage associated with the highest logical level for a TLC memory cell of the memory page. Similarly, the current value of voltage 812 can be the current value for the reference voltage associated with the second highest logical level for a TLC memory cell of the memory page.

In other or similar embodiments, the reference voltage can correspond to a voltage at a particular quantile of the voltage distribution. For example, the reference voltage can correspond to a 50% quantile of the voltage distribution. As illustrated in FIG. 9A, voltage 910 can correspond to a voltage measured at a 50% quantile of voltage distribution 810 and voltage 920 can correspond to a voltage measured at a 50% quantile of voltage distribution 820. As such, the current value of voltage 920 can be the current value for the reference voltage associated with the highest logical level for a TLC memory cell of the memory page. Similarly, the current value of voltage 910 can be the current value for the reference voltage associated with the second highest logical level for a TLC memory cell of the memory page. It should be noted that although some embodiments and examples the present disclosure refer to processing logic (e.g., block family manager component 113) using a 50% quantile of a voltage distribution as a reference voltage, processing logic can use any quantile of a voltage distribution as a reference voltage. For example, processing logic can use a 25% quantile, 30% quantile 40% quantile, 75% quantile, etc. of a voltage distribution as a reference voltage.

Referring back to FIG. 7, at block 730, processing logic determines an amount of voltage shift for the memory page based on the current value for the reference voltage and a prior value for the reference voltage. The prior value for the reference voltage can be associated with a voltage distribution for the memory page at a time period before processing logic measures the current memory access voltage distribution for the memory page at block 710 (i.e., a prior voltage distribution). In some embodiments, the prior voltage distribution can correspond to a voltage distribution for the memory page immediately or soon after data for the memory page and/or the block family was programmed (i.e., written) to the memory device. In other or similar embodiments, the prior voltage distribution can correspond to a voltage distribution at any time before the processing logic measures the current voltage distribution for the memory page.

Figure 9B:
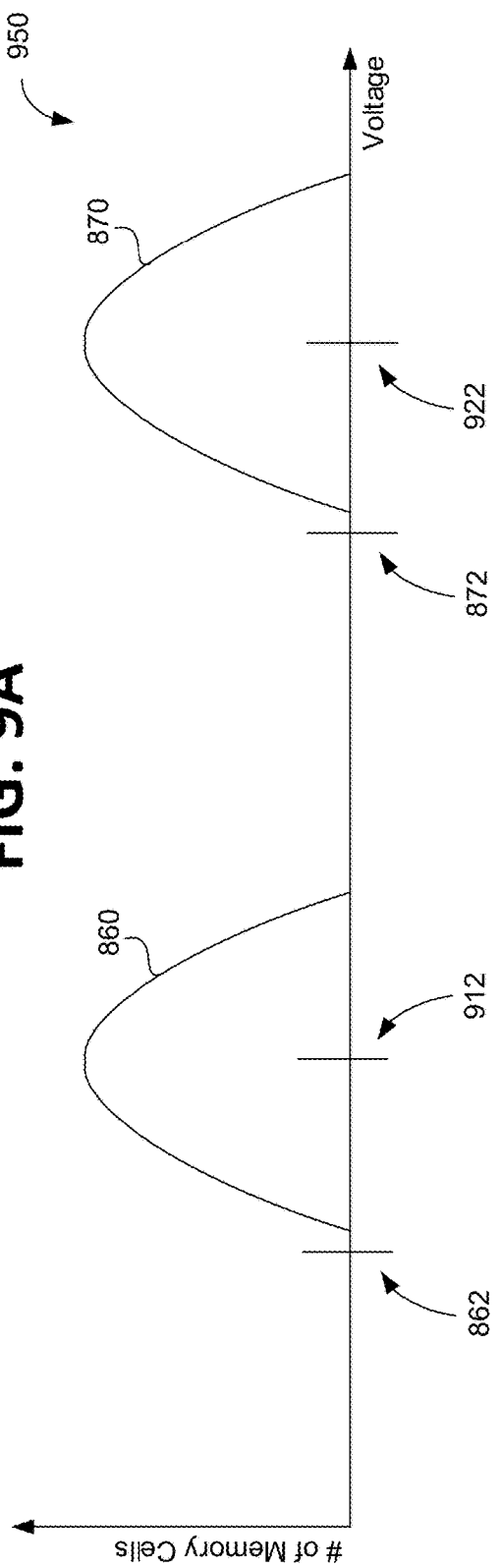

FIGS. 8B and 9B illustrate prior voltage distributions 860, 870 for the memory page, in accordance with embodiments of the present disclosure. In some embodiments, prior voltage distributions 860, 870 can be specific to each memory page of each block family at the memory device. In other or similar embodiments, prior voltage distributions 860, 870 can be specific to each block family at the memory device. For example, processing logic can associate prior voltage distributions 860, 870 with a particular block family and, accordingly, each memory page of the block family is therefore associated with prior voltage distributions 860, 870. It should be noted that although some embodiments and examples of the present disclosure refer to prior voltage distributions 860, 870 being associated with the memory page measured at block 710, prior memory distributions 860, 870 can be associated with sets of memory pages of any granularity (e.g., block families, voltage bins, memory device, etc.).

In accordance with previously described embodiments and examples, prior voltage distributions 860, 870 can each correspond to a voltage distribution for a distinct logical level of memory cells of the memory page. For example, voltage distribution 870 can correspond to a prior voltage distribution for a highest logical level associated with a memory cell (e.g., a TLC memory cell) and voltage distribution 860 can correspond to a prior voltage distribution for a second highest logical level associated with the memory cell.

Processing logic can determine a prior value for the reference voltage in view of the prior voltage distribution 860, 870 associated with the memory page. As described above, the reference voltage can correspond to a voltage at a particular point of a voltage distribution. For example, the reference voltage can correspond to a voltage at a tail end of a voltage distribution. In some embodiments, a voltage at a tail end of a prior voltage distribution can correspond to a voltage applied to the memory cells during a programming operations performed by the memory sub-system controller 115 to write data to the memory page (referred to as a programming voltage or a write voltage). As illustrated in FIG. 8B, voltage 872 corresponds to the programming voltage (also referred to as a program verify (PV) voltage) used by the memory sub-system controller 115 to program data at a highest logical level at a memory cell of the memory page (e.g., PV voltage for level 7 of a TLC memory cell). Voltage 874 corresponds to a voltage associated with a tail end of voltage distribution 870 at a time period immediately or soon after programming the memory page. As seen in FIG. 8B, the value of voltage 874 approximately corresponds to the value of voltage 872. As the value of voltage 874 approximately corresponds to the value of voltage 872, processing logic can use the programming voltage for the highest logical level of the memory cells of the memory page as the reference voltage. Accordingly, processing logic can determine that the prior value for the reference voltage for the highest logical level of memory cells of the memory page corresponds to voltage 872.

Voltage 862 corresponds to the programming voltage (i.e., a PV voltage) used by memory sub-system controller 115 to program data at a second highest logical level at a memory cell of the memory page (e.g., PV voltage for level 6 of a TLC memory cell). Voltage 864 corresponds to a voltage associated with a tail end of voltage distribution 860 at the time period immediately or soon after programming the memory. As the value of voltage 864 approximately corresponds to the value of voltage 862, processing logic can similarly use the programming voltage for the highest logical level of the memory cells of the memory page as the reference voltage. Accordingly, processing logic can determine that the prior value for the reference voltage for the second highest logical level of memory cells of the memory page corresponds to voltage 862.

By using the programming voltage as the prior value for the reference voltage for voltage distributions 860, 870, processing logic can determine the prior value for the reference voltage without measuring the voltage distribution of the memory pages immediately or soon after programming. For example, immediately or soon after programming, processing logic can store an indication of the voltage used to program the memory page(s) at a memory for the memory sub-system controller 115 (e.g., local memory 119). During a calibration scan, processing logic can access the memory for the memory sub-system controller 115 to determine the programming voltage for the memory pages and use the programming voltage as the prior value for the reference voltage, in accordance with embodiments described herein.

As described above, processing logic can determine an amount of voltage shift for the memory page based on the current value for the reference voltage and a prior value of the reference voltage. Referring to FIG. 8A, processing logic can determine the amount of voltage shift 878 for voltage distribution 820 based on a difference between voltage 822 (i.e., the current value of the reference voltage associated with the highest logical memory cell level) and voltage 872 (i.e., a prior value of the reference voltage associated with the highest logical memory cell level). Similarly, processing logic can determine the amount of voltage shift 868 for voltage distribution 810 based on a difference between voltage 812 (i.e., the current value of the reference voltage associated with the second highest logical memory cell level) and voltage 862 (i.e., a prior value of the reference voltage associated with the second highest logical memory cell level).

In other or similar embodiments, the reference voltage for a voltage distribution can correspond to a voltage at a particular quantile of a voltage distribution. For example, the reference voltage can correspond to a voltage at a 50% quantile of a voltage distribution. In such examples, processing logic can determine the prior value for the reference voltage based on an offset representing a difference between the voltage at a tail end of a voltage distribution and a voltage at a 50% quantile of the voltage distribution immediately or soon after programming a memory page. As described above, the voltage at a tail end of a voltage distribution can approximately correspond to a programming voltage associated with programming memory cells of a respective logical level. For example, as illustrated in FIG. 9B, voltage 872 can correspond to a programming voltage associated with programming memory cells of a highest logical level and voltage 862 can correspond to a programming voltage associated with programming memory cells of a second highest logical level.

In some embodiments, processing logic can determine the voltage at the 50% quantile of the voltage distribution based on experimental data and/or manufacturing data collected for the memory device. For example, experimental and/or manufacturing data can be collected for the memory device before the memory device is installed or initialized at the memory sub-system (e.g., at a memory device manufacturing system, a memory device testing system, etc.). The experimental and/or manufacturing data collected for the memory device can correspond to the voltage distribution for a memory page immediately or soon after programming data to each logical level at a memory cell of the memory device. Accordingly, the experimental and/or manufacturing data can indicate, for each logical level, a voltage at a tail end of a voltage distribution and a voltage at a 50% quantile of the voltage distribution immediately or soon after programming a memory page. In some embodiments, an operator of the testing system and/or a manufacturing system can store the experimental and/or manufacturing data collected for the memory device to a memory associated with the memory sub-system controller 115 (e.g., local memory 119). In such embodiments, processing logic can determine, for each logical level, a difference between the voltage at the tail end of the voltage distribution and the voltage at the 50% quantile of the voltage distribution (referred to as a voltage distribution offset). In other or similar embodiments, the operator can store the voltage distribution offset for each logical level at the memory associated with the memory sub-system controller 115.

Processing logic can determine the prior value for the reference voltage for a respective logical level of memory cells based on the programming voltage associated with the respective logical level and the voltage distribution offset for the respective logical level. As illustrated in FIG. 9B, voltage 922 can correspond to a voltage at a 50% quantile of voltage distribution 870. Processing logic can determine the value of voltage 922 based on voltage 872 (i.e., the programming voltage associated with the highest logical level of memory cells of the memory page) and the voltage distribution offset for the highest logical level of memory cells. Voltage 912 can correspond to a voltage at a 50% quantile of voltage distribution 860. Processing logic can determine the value of voltage 912 based on voltage 862 (i.e., the programming voltage associated with the second highest logical level of memory cells of the memory page) and the voltage distribution offset for the second highest logical level of memory cells. Accordingly, processing logic can use the value of voltages 912 and 922 as the prior value for the reference voltage without measuring the voltage distribution for the memory page immediately or soon after programming at the memory device.

Referring to FIG. 9A, processing logic can determine the amount of voltage shift 924 for voltage distribution 820 based on a difference between voltage 920 (i.e., the current value of the reference voltage associated with the highest logical memory cell level) and voltage 922 (i.e., a prior value of the reference voltage associated with the highest logical memory cell level). Similarly, processing logic can determine the amount of voltage shift 914 for voltage distribution 810 based on a difference between voltage 910 (i.e., the current value of the reference voltage associated with the second highest logical memory cell level) and voltage 912 (i.e., a prior value of the reference voltage associated with the second highest logical memory cell level).

Referring back to FIG. 7, at block 740, processing logic determines whether the amount of voltage shift for the memory page satisfies a voltage shift criterion. In some embodiments, processing logic determines that the memory page satisfies a voltage shift criterion in response to determining an amount of voltage shift determined at block 730 meets or exceeds a threshold amount of voltage shift. Similarly, processing logic can determine that the memory page does not satisfy the voltage shift criterion in response to determining the amount of voltage shift does not exceed the threshold amount of voltage shift. In response to determining that the amount of voltage shift does not satisfy the voltage shift criterion, method 700 continues to block 750, where the processing logic associates the block family with the first voltage bin at the memory device. In response to determining that the amount of voltage shift satisfies the voltage shift criterion, method 700 continues to block 760. At block 760, processing logic associates the block family with a second voltage bin at the memory device that is associated with a second voltage offset. In some embodiments, processing logic can associate the block family with the second voltage bin by updating a pointer to a voltage bin boundary for the second voltage bin, as previously described. For example, processing logic can update a metadata table for the block family including the memory page to indicate that the pointer for the second voltage bin to corresponds with the block family.

In some embodiments, the processing logic can modify the reference voltage from a first type to a second type during operation of the memory sub-system. For example, the processing logic can use a voltage associated with the tail end of a voltage distribution as a reference voltage. During operation of the memory sub-system 110, processing logic can monitor the performance of operations at each block family of the memory device and maintain a performance metric (e.g., a bit error rate) for each block family. In some embodiments, processing logic can determine that the performance metric for the block family satisfies a performance criterion (e.g., falls below a performance metric threshold). In such embodiments, the processing logic can use the voltage associated with a particular quantile (e.g., a 50% quantile) of a voltage distribution as a reference voltage, in accordance with previously described embodiments.

Figure 10:
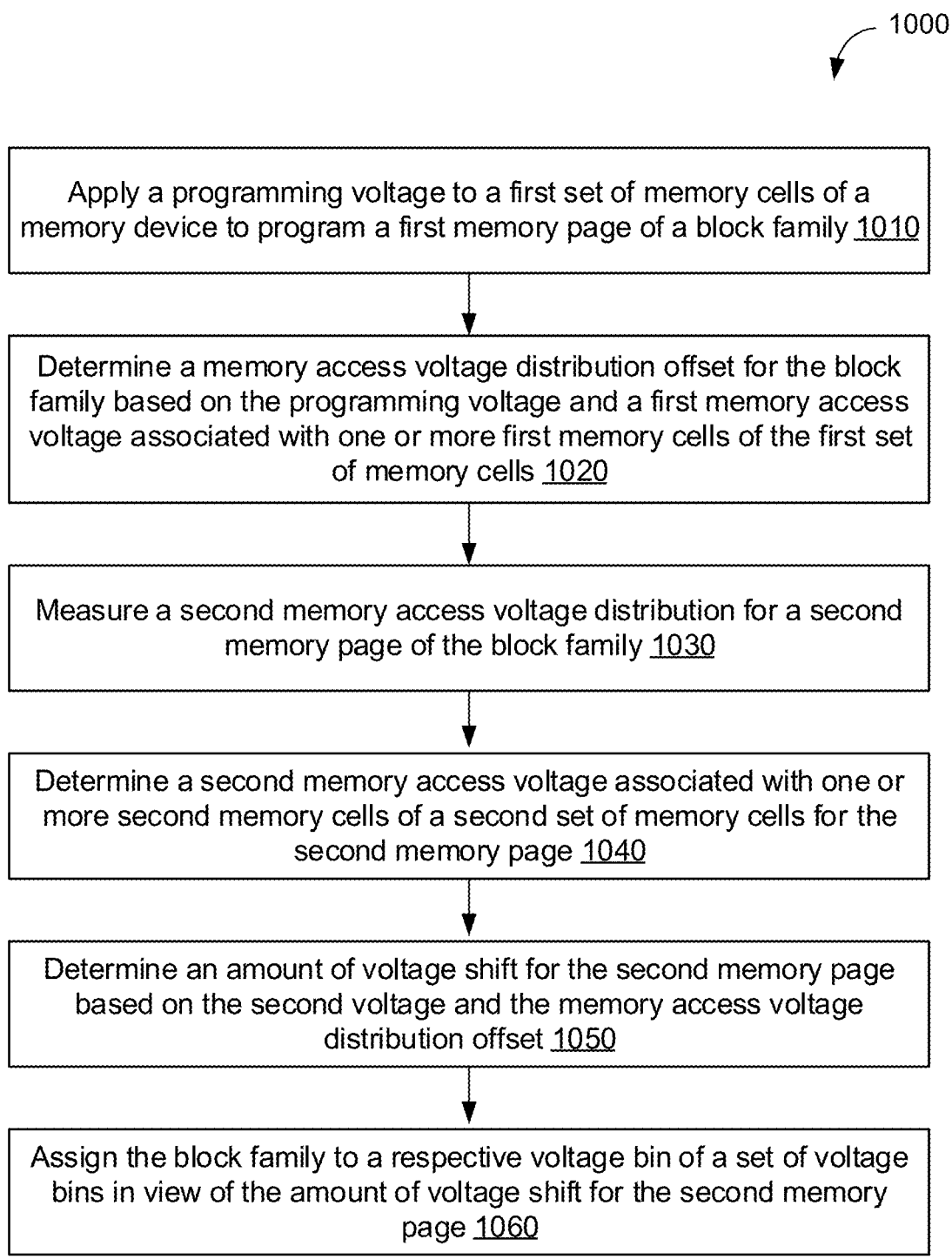
FIG. 10 is a flow diagram of another example method for voltage bin calibration based on a voltage distribution reference voltage, in accordance with some embodiments of the present disclosure.

FIG. 10 is a flow diagram of another example method 1000 for voltage bin calibration based on a voltage distribution reference voltage, in accordance with some embodiments of the present disclosure. The method 1000 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1000 is performed by the block family manager component 113 of FIG. 1. In other or similar embodiments, one or more operations of method 1000 is performed by another component of the memory sub-system controller, such as a block family manager. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1010, processing logic applies a programming voltage to a first set of memory cells of a memory device to program a first memory page of a block family. The processing logic applies the programming voltage to the first set of memory cells in response to determining that a memory access voltage distribution offset calibration criterion is satisfied. In some embodiments, processing logic can determine that the voltage distribution offset calibration criterion is satisfied in response to determining that an amount of time since the memory device was initialized exceeds a threshold amount of time. In other or similar embodiments, processing logic can determine that the voltage distribution offset calibration criterion is satisfied by determining that a width of a current voltage distribution for a memory page exceeds a threshold width.

As described with respect to FIG. 7, processing logic can use a voltage at a particular quantile (e.g., a 50% quantile) of a voltage distribution as a reference voltage. The prior value for the reference voltage can be determined based on a programming voltage associated with a respective logical level of memory cells at a memory page and a voltage distribution offset. The voltage distribution offset corresponds to a difference between a voltage at a tail end of a voltage distribution and the voltage at the 50% quantile of the voltage distribution at a time immediately or soon after programming of the memory cells at the respective logical level. The voltage distribution offset can be determined based on experimental and/or manufacturing data for the memory device immediately or soon after programming, the voltage distribution offset corresponds to a width of the voltage distribution for the memory device immediately or soon after programming. In some embodiments, the width of the voltage distribution for a respective logical level changes during operation of the memory device and the voltage distribution offset no longer corresponds to the distribution width.

Figure 11:
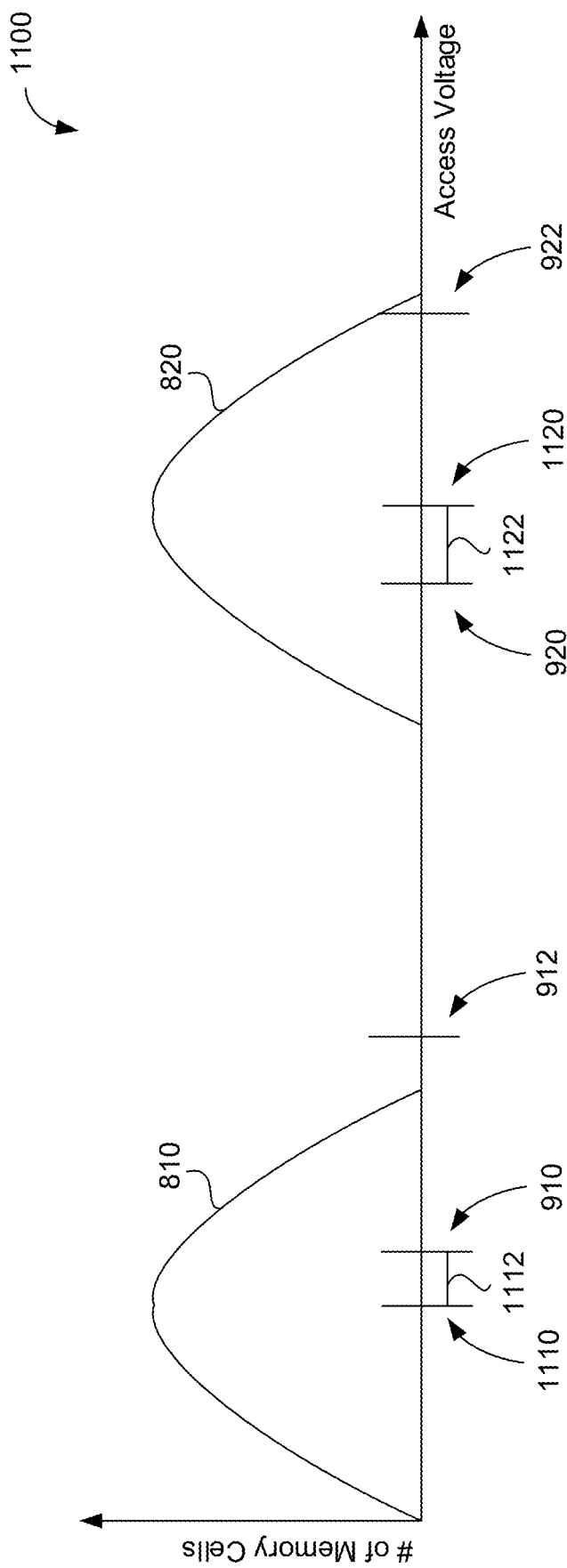
FIG. 11 illustrates a change in the width of a memory access voltage distribution during operation of a memory device, in accordance with embodiments of the present disclosure.

FIG. 11 illustrates a change in the width of a voltage distribution during operation of a memory device, in accordance with embodiments of the present disclosure. As described above, voltage distribution 820 represents the current voltage distribution associated with the highest logical level for memory cells of a memory page and voltage distribution 810 represents the current voltage distribution associated with the second highest logical level for memory cells of a memory page. Voltage 922 corresponds to a prior value for a reference voltage for voltage distribution 820 and voltage 912 corresponds to a prior value for a reference voltage for voltage distribution 810. Voltage 1120 represents a current value for the reference voltage for voltage distribution 820 and voltage 1110 corresponds to a prior value for the reference voltage for voltage distribution 810. Voltages 1120 and 1110 are measured by processing logic in accordance with embodiments previously described.

As seen in FIG. 11, voltage 1120 does not approximately correspond to voltage 920, which represents the current value for the reference voltage for voltage distribution 820, as described with respect to FIG. 9A. This indicates that a width of voltage distribution 820 is changing during operation of the memory device. Similarly, voltage 1110 does not approximately correspond to voltage 910, which represents the current value for the reference voltage for voltage distribution 810, as described with respect to FIG. 9, indicating that a width of voltage distribution 810 is also increasing during operation of the memory device. Processing logic can determine that the voltage distribution offset calibration criterion is satisfied in response to determining that a difference 1112 between voltage 910 and voltage 1110 and/or a difference 1122 between voltage 920 and voltage 1120 exceed a threshold difference. A determination that the difference between voltage 910 and voltage 1110 and/or a difference between 920 and 1120 indicates that a width of a respective voltage distribution exceeds a threshold width and that the current voltage distribution offset no longer applies to voltage distributions 810 and 820.

In some embodiments, responsive to determining that the voltage distribution offset calibration criterion is satisfied, processing logic can measure the voltage distribution for the memory page and/or the block family immediately or soon after a programming operation (e.g., a write operation) is performed for the memory page and/or the block family. For example, processing logic can transmit an instruction to memory sub-system controller 115 indicating that a measurement is to be obtained for the memory page and/or block family immediately or soon after data received from the host system 120 is scheduled to be programmed to the memory page and/or the block family. The instruction can cause the memory sub-system controller 115 to measure the memory page and/or the block family in response to determining that the host data is programmed to the memory page and/or the block family. In another example, processing logic can detect that memory sub-system controller 115 has completed performance of an operation to program host data to the memory page and/or the block family and can subsequently measure the voltage distribution for memory cells of the memory page and/or the block family.

At block 1020, processing logic determines a voltage distribution offset (also referred to as a voltage distribution offset) for the block family based on the programming voltage and a first memory access voltage associated with one or more first memory cells of the first set of memory cells. The one or more first memory cells can be associated with a particular quantile (e.g., a 50% quantile) of a first voltage distribution for the memory page. Processing logic can determine the first voltage distribution for the memory page based on the measurement performed for the memory page and/or the block family, as described above. In some embodiments, processing logic can determine the voltage distribution offset by determining a difference between the programming voltage used to program the data to the memory page and/or the block family and the first memory access voltage associated with the memory cells at the particular quantile of the first voltage distribution for the memory page. In some embodiments, the first memory access voltage can correspond to the prior value for the reference voltage, in accordance with embodiments described above.

At block 1030, processing logic measures a second voltage distribution for a second memory page of the block family. Processing logic can measure the second voltage distribution for the second memory page in accordance with embodiments described with respect to FIG. 7. For example, processing logic can measure the second voltage distribution for the second memory page at a time period after the time period at which the programming voltage was applied to program the memory cells of the memory page and/or the block family. At block 1040, processing logic determines a second memory access voltage associated with one or more second memory cells of a second set of memory cells for the second memory page. Each of the second memory cells are associated with the particular quantile (e.g., the 50% quantile) of the second voltage distribution. In some embodiments, the second memory access voltage can correspond to the current value for the reference voltage, in accordance with previously described embodiments.

At block 1050, processing logic determines an amount of voltage shift for the second memory page based on the second voltage and the voltage distribution offset. As described with respect to block 1020, the voltage distribution offset corresponds to a difference between the programming voltage used to program the data to the memory page and/or the block family and the first memory access voltage associated with the memory cells at the particular quantile. Processing logic can determine the amount of voltage shift for the second memory page based on a difference between the second voltage and the voltage distribution offset, in accordance with embodiments described herein.

At block 1060, processing logic assigns the block family to a respective voltage bin of a set of voltage bins in view of the amount of voltage shift for the second memory page. As described above, processing logic can assign the block family to the respective voltage bin by associating the block family with a respective voltage bin that corresponds to the determined amount of voltage shift for the second memory page. For example, processing logic can update a pointer for a voltage bin boundary for the respective voltage bin to correspond with the block family.

In some embodiments, processing logic can determine to perform the calibration scan for the block family again (e.g., in response to determining that a threshold number of P/E cycles have occurred). In such embodiments, processing logic can perform the calibration scan in accordance with embodiments described with respect to FIG. 7. During the calibration scan, processing logic can use the voltage distribution offset determined at block 1020 as the voltage distribution offset instead of the voltage distribution offset determined based on experimental and/or manufacturing data, in accordance with some embodiments.

Figure 12:
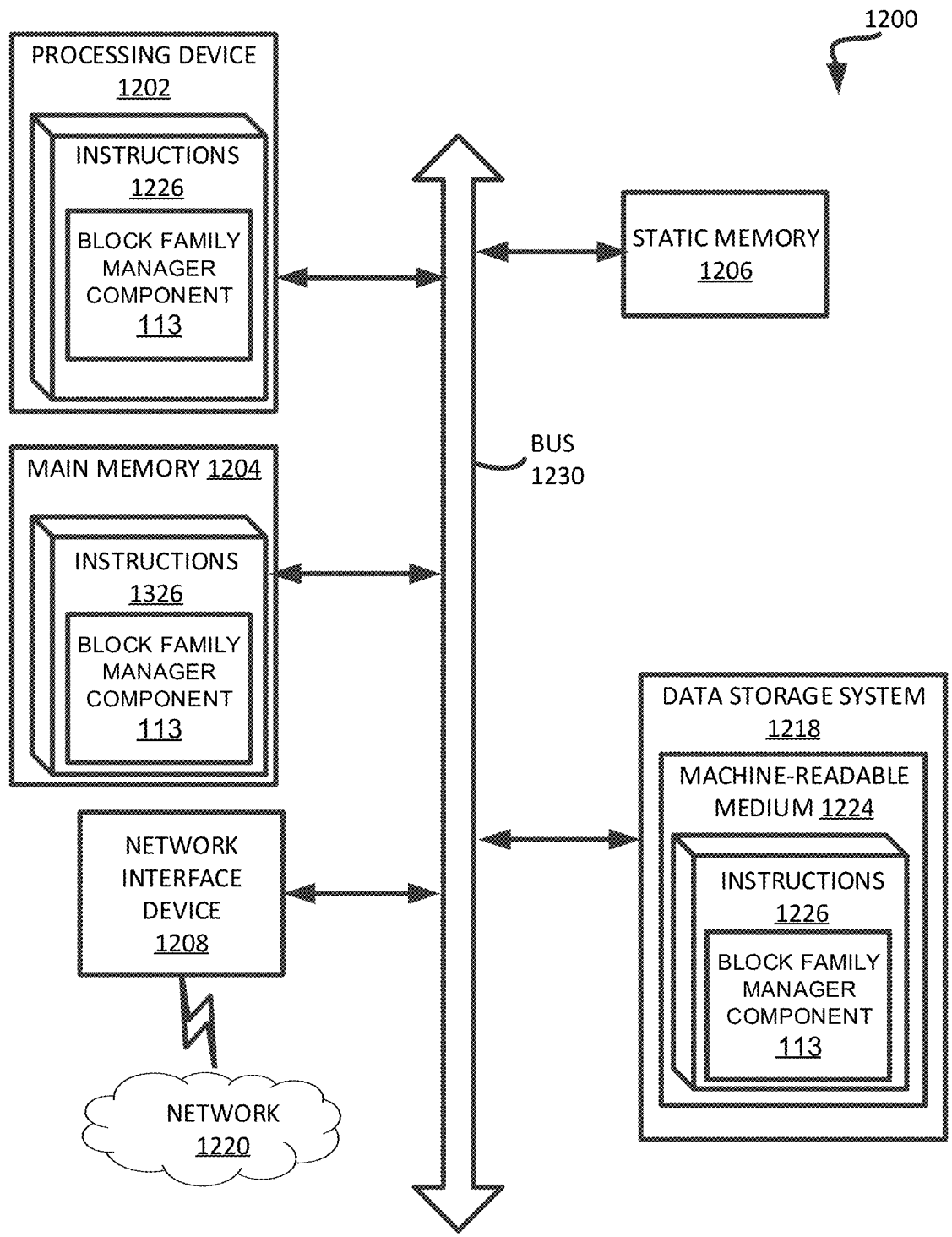
FIG. 12 is a block diagram of an example computer system in which embodiments of the present disclosure may operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform block operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or RDRAM, etc.), a static memory 1206 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1226 for performing the operations and steps discussed herein. The computer system 1200 can further include a network interface device 1208 to communicate over the network 1220.

The data storage system 1218 can include a machine-readable storage medium 1224 (also known as a computer-readable medium) on which is stored one or more sets of instructions 1226 or software embodying any one or more of the methodologies or functions described herein. The instructions 1226 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1.

In one embodiment, the instructions 1226 include instructions to implement functionality corresponding to a voltage bin boundary component (e.g., the block family manager component 113 of FIG. 1). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
measuring a current memory access voltage distribution for a memory page of a block family associated with a first voltage bin of a plurality of voltage bins at a memory device, wherein the first voltage bin is associated with a first voltage offset;

determining a current value for a reference voltage based on the current memory access voltage distribution measured for the memory page;

determining an amount of voltage shift for the memory page based on the current value for the reference voltage and a prior value for the reference voltage, wherein the prior value for the reference voltage is associated with a prior memory access voltage distribution for the memory page; and responsive to determining that the amount of voltage shift satisfies a voltage shift criterion, associating the block family with a second voltage bin of the plurality of voltage bins, wherein the second voltage bin is associated with a second voltage offset.

2. The method of claim 1, wherein the prior memory access voltage distribution for the memory page corresponds to a memory access voltage distribution for the memory page when data for the memory page was written to the memory device.

3. The method of claim 1, wherein the prior value for the reference voltage corresponds to a prior memory access voltage associated with one or more memory cells of a plurality of memory cells for the memory page.

4. The method of claim 3, wherein determining the current value for the reference voltage comprises obtaining a current voltage for the one or more memory cells, and wherein determining the amount of voltage shift comprises determining a voltage difference between the current memory access voltage for the one or more memory cells and the prior memory access voltage for the one or more memory cells.

5. The method of claim 3, wherein the prior memory access voltage corresponds to a threshold voltage value associated with programming data to the memory page of the block family.

6. The method of claim 3, wherein determining the current value for the reference voltage comprises determining a current memory access voltage associated with a current set of memory cells of the plurality of memory cells that are associated with a particular quantile of the current memory access voltage distribution for the memory page, and wherein determining the amount of voltage shift for the memory page comprises determining a difference between the current memory access voltage associated with the current set of memory cells and a prior memory access voltage associated with a prior set of memory cells associated with the particular quantile of the prior memory access voltage distribution for the memory page.

7. The method of claim 6, wherein the prior memory access voltage associated with the prior set of memory cells associated with the particular quantile of the prior memory access voltage distribution is determined based on the prior value for the reference voltage and experimental data collected for the memory device prior to initialization of the memory device.

8. The method of claim 1, wherein measuring the current memory access voltage distribution for the memory page comprises:

selecting the memory page from a plurality of memory pages of the block family; and sampling one or more memory cells of the memory page.

9. The method of claim 1, wherein the current memory access voltage distribution and the prior memory access voltage distribution each correspond to at least one of a read voltage distribution or a write voltage distribution.

10. A system comprising:

a memory device associated with a plurality of voltage bins each corresponding to a particular voltage offset; and a processing device coupled to the memory device, the processing device to perform operations comprising:

applying a programming voltage to a first plurality of memory cells of the memory device to program a first memory page of a block family;

determining a memory access voltage distribution offset for the block family based on the programming voltage and a first memory access voltage associated with one or more first memory cells of the first plurality of memory cells, wherein each one or more first memory cells are associated with a particular quantile of a first memory access voltage distribution for the first memory page;

responsive to measuring a second memory access voltage distribution for a second memory page of the block family, determining a second memory access voltage associated with one or more second memory cells of a second plurality of memory cells for the second memory page, wherein each of the one or more second memory cells are associated with the particular quantile of the second memory access voltage distribution;

determining an amount of voltage shift for the second memory page based on the second voltage and the memory access voltage distribution offset; and assigning the block family to a respective voltage bin of the plurality of voltage bins in view of the determined amount of voltage shift for the second memory page.

11. The system of claim 10, wherein the processing device is to perform the operations comprising applying the programming voltage to a first plurality of memory cells of the memory device to program the first memory page of the block family responsive to determining that a memory access voltage distribution offset calibration criterion is satisfied.

12. The system of claim 11, wherein determining that the memory access voltage distribution offset calibration criterion is satisfied comprises:

determining that an amount of time since the memory device was initialized exceeds a threshold amount of time.

13. The system of claim 11, wherein the operations further comprise:

measuring a third memory access voltage distribution for the first memory page prior to applying the programming voltage to the first plurality of memory cells of the memory device to program the first memory page of the block family, and wherein determining that the memory access voltage distribution offset calibration criterion is satisfied comprises determining that a width of the third memory access voltage distribution exceeds a threshold width.

14. The system of claim 10, wherein the operations further comprise:

responsive to applying the programming voltage to the first plurality of memory cells of the memory device, measuring the first memory access voltage distribution for the first memory page.

15. The system of claim 10, wherein the first memory access voltage distribution and the second memory access voltage distribution each correspond to at least one of a read voltage distribution or a write voltage distribution.

16. A non-transitory computer-readable storage medium comprising instructions that, when executed by a processing device, cause the processing device to perform operations comprising:
- measuring a current memory access voltage distribution for a memory page of a block family associated with a first voltage bin of a plurality of voltage bins at a memory device, wherein the first voltage bin is associated with a first voltage offset;
- determining a current value for a reference voltage based on the current memory access voltage distribution measured for the memory page;
- determining an amount of voltage shift for the memory page based on the current value for the reference voltage and a prior value for the reference voltage, wherein the prior value for the reference voltage is associated with a prior memory access voltage distribution for the memory page; and
- responsive to determining that the amount of voltage shift satisfies a voltage shift criterion, associating the block family with a second voltage bin of the plurality of voltage bins, wherein the second voltage bin is associated with a second voltage offset.

17. The non-transitory computer-readable storage medium of claim 16, the prior memory access voltage distribution for the memory page corresponds to a memory access voltage distribution for the memory page when data for the memory page was written to the memory device.

18. The non-transitory computer-readable storage medium of claim 16, wherein the prior value for the reference voltage corresponds to a prior memory access voltage associated with one or more memory cells of a plurality of memory cells for the memory page.

19. The non-transitory computer-readable storage medium of claim 18, wherein determining the current value for the reference voltage comprises obtaining a current voltage for the one or more memory cells, and wherein determining the amount of voltage shift comprises determining a voltage difference between the current memory access voltage for the one or more memory cells and the prior memory access voltage for the one or more memory cells.

20. The non-transitory computer-readable storage medium of claim 18, wherein the prior memory access voltage corresponds to a threshold voltage value associated with programming data to the memory page of the block family.

* * * * *